United States Patent
Chen et al.

(10) Patent No.: US 9,607,941 B2
(45) Date of Patent: Mar. 28, 2017

(54) CONDUCTIVE VIA STRUCTURE AND FABRICATION METHOD THEREOF

(71) Applicant: Siliconware Precision Industries Co., Ltd., Taichung (TW)

(72) Inventors: Yan-Heng Chen, Taichung (TW); Chun-Tang Lin, Taichung (TW); Chieh-Yuan Chi, Taichung (TW); Mu-Hsuan Chan, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/669,527

(22) Filed: Mar. 26, 2015

(65) Prior Publication Data
US 2015/0294938 A1    Oct. 15, 2015

(30) Foreign Application Priority Data
Apr. 15, 2014   (TW) .............................. 103113640 A

(51) Int. Cl.
*H01L 21/768*     (2006.01)
*H01L 23/31*      (2006.01)
(Continued)

(52) U.S. Cl.
CPC .... *H01L 23/5226* (2013.01); *H01L 21/76802* (2013.01); *H01L 21/76879* (2013.01); *H01L 23/3107* (2013.01); *H01L 23/49822* (2013.01); *H01L 23/49827* (2013.01); *H01L 23/5389* (2013.01); *H01L 23/53228* (2013.01); *H01L 21/76831* (2013.01); *H01L 23/3114* (2013.01); *H01L 2924/0002* (2013.01)

(58) Field of Classification Search
CPC ... H01L 23/5226; H01L 23/28; H01L 23/315; H01L 23/481; H01L 21/76802; H01L 21/76877; H01L 21/76879; H01L 23/49827; H01L 2924/181; H01L 2225/06548; H01L 2924/15153; H01L 2924/3511; H01L 2224/04105; H01L 2224/0557; H01L 21/486; H01L 21/561; H01L 21/56; H01L 23/5389; H01L 2924/15192
See application file for complete search history.

(56) References Cited

U.S. PATENT DOCUMENTS 6,433,409 B2 *  8/2002  Mita .............................. 257/673
8,004,095 B2 *  8/2011  Shim .................... H01L 21/568
                                                    257/774
(Continued)

*Primary Examiner* — Jasmine Clark
(74) *Attorney, Agent, or Firm* — Mintz Levin Cohn Ferris Glovsky and Popeo, P.C.; Peter F. Corless; Steven M. Jensen

(57) ABSTRACT

A method for fabricating a conductive via structure is provided, which includes the steps of: forming in an encapsulant a plurality of openings penetrating therethrough; forming a dielectric layer on the encapsulant and in the openings of the encapsulant; forming a plurality of vias in the dielectric layer in the openings of the encapsulant; and forming a conductive material in the vias to thereby form conductive vias. Therefore, by filling the openings having rough wall surfaces with the dielectric layer so as to form the vias having even wall surfaces, the present invention improves the quality of the conductive vias.

16 Claims, 4 Drawing Sheets

(51) Int. Cl.
*H01L 23/532* (2006.01)
*H01L 23/522* (2006.01)
*H01L 23/498* (2006.01)
*H01L 23/538* (2006.01)

(56) References Cited

U.S. PATENT DOCUMENTS

2013/0249106 A1* 9/2013 Lin .................... H01L 24/19
257/774
2013/0341620 A1* 12/2013 Birner ................ H01L 22/30
257/48

* cited by examiner

FIG.1C" (PRIOR ART)

CONDUCTIVE VIA STRUCTURE AND FABRICATION METHOD THEREOF

CROSS-REFERENCES TO RELATED APPLICATIONS

This application claims under 35 U.S.C. §119(a) the benefit of Taiwanese Application No. 103113640, filed Apr. 5, 2014, the entire contents of which are incorporated herein by reference.

BACKGROUND OF THE INVENTION

1. Field of the Invention

The present invention relates to through molding via (TMV) technology, and more particularly, to a conductive via structure and a fabrication method thereof.

2. Description of Related Art

Currently, through molding via (TMV) technology has been widely applied in semiconductor fields. The TMV technology mainly involves forming openings on a surface of an encapsulant through laser ablation so as to expose electrical contacts, such as circuits or conductive pads, beneath the encapsulant.

For example, the TMV technology can be used for fabricating fan-out type package on package (POP) structures. FIGS. 1A to 1D are schematic cross-sectional views showing a method for fabricating a conductive via structure for a fan-out type package on package structure according to the prior art.

Referring to FIG. 1A, a packaging substrate 10 having a plurality of circuit layers 100 is disposed on a support member 9. A chip 11 is disposed on the packaging substrate 10 and an encapsulant 12 is formed on the packaging substrate 10 to encapsulate the chip 11.

Referring to FIG. 1B, a dielectric layer 13 is formed on the encapsulant 12.

Referring to FIG. 1C, a plurality of openings 130 are formed by laser drilling to penetrate the dielectric layer 13 and the encapsulant 12, thereby exposing a portion of the uppermost circuit layer 100, i.e., conductive pads, from the openings 130.

Referring to FIG. 1D, a conductive material 14 such as copper is formed on the dielectric layer 13 and in the openings 130 by electroplating. As such, the conductive material 14 on the dielectric layer 13 forms a fan-out type redistribution layer 141 and the conductive material 14 in the openings 130 forms a plurality of conductive vias 140 that electrically connect the circuit layer 100 and the redistribution layer 141.

Subsequently, referring to FIG. 1E, an insulating layer 15 is formed on the redistribution layer 141 and the dielectric layer 13, and a plurality of openings 150 are formed in the insulating layer 15 for exposing conductive pads 142 of the redistribution layer 141. Thereafter, a surface processing layer 16 is formed on the conductive pads 142 for mounting a plurality of conductive elements, for example, solder balls (not shown). As such, a semiconductor package 1 is obtained. Finally, the support member 9 is removed.

Referring to FIG. 1C, the openings 130 have a maximum width R of 100 to 200 um. As semiconductor packages are developed toward the trend of high performance and small size, the width of the openings is becoming smaller and smaller and the density of the openings is becoming higher and higher.

However, as shown in FIG. 1C', the openings 130 formed by laser drilling generally have uneven wall surfaces 130a.

The wall surfaces 130a have a roughness Ra of 50 um. Therefore, the conductive vias 140 formed in the openings 130 have serrated surfaces, as shown in FIG. 1D. As such, electric charges easily concentrate on protruding portions of the surfaces of the conductive vias 140, thereby easily causing joule heating under high resistance and consequently causing an open circuit to occur.

Further, during the copper electroplating process, a thin copper seed layer (not shown) is first formed by sputtering. However, since copper is not compatible with the encapsulant 12, the copper seed layer easily peels off from the rough wall surfaces 130a of the openings 130, thus causing delamination of the conductive material 14 and reducing the reliability of the semiconductor package 1.

Accordingly, referring to FIG. 1C'', a passivation layer 12' can be formed on the wall surfaces 130a of the openings 130 so as to form vias 120 that have reduced roughness. Thereafter, the conductive material 14 can be formed in the vias 120. However, since the passivation layer 12' only has a thickness t of 1 to 2 um, it cannot effectively reduce the roughness of the wall surfaces 130a of the openings 130. That is, the wall surfaces 120a of the vias 120 are still rough. Therefore, such a method cannot overcome the above-described drawbacks of open circuit and delamination of the conductive material.

Therefore, there is a need to provide a conductive via structure and a fabrication method thereof so as to overcome the above-described drawbacks.

SUMMARY OF THE INVENTION

In view of the above-described drawbacks, the present invention provides a conductive via structure, which comprises: an encapsulant having a plurality of openings penetrating therethrough; a dielectric layer formed on the encapsulant and filled in the openings of the encapsulant, wherein a plurality of vias are formed in the dielectric layer in the openings of the encapsulant; and a conductive material filled in the vias.

The present invention further provides a method for fabricating a conductive via structure, which comprises the steps of: forming in an encapsulant a plurality of openings penetrating therethrough; forming a dielectric layer on the encapsulant and in the openings of the encapsulant; forming a plurality of vias in the dielectric layer in the openings of the encapsulant; and forming a conductive material in the vias.

In the above-described structure and method, the openings of the encapsulant can be formed by laser drilling. The openings of the encapsulant can have uneven wall surfaces and the wall surfaces of the openings can have an average roughness of 2 to 60 um.

In the above-described structure and method, the openings can have a maximum width of 40 to 400 um.

In the above-described structure and method, the dielectric layer can be made of a photosensitive material.

In the above-described structure and method, the dielectric layer in the openings of the encapsulant can have a thickness of 30 to 50 um.

In the above-described structure and method, the vias can be formed by exposure. The vias can have even wall surfaces and the vias can have a maximum width of 30 to 350 um.

In the above-described structure and method, the conductive material can be copper and formed by electroplating and the vias can be completely filled with the conductive material.

Therefore, by filling the openings having rough wall surfaces with the dielectric layer so as to form the vias having even wall surfaces in the dielectric layer, the present invention prevents concentration of electric charges on protruding portions of the rough wall surfaces of the conductive vias as in the prior art, thereby preventing joule heating caused by accumulation of too many electric charges and hence preventing an open circuit from occurring.

Further, since copper is compatible with the dielectric layer, copper does not peel off from the wall surfaces of the vias. As such, the present invention prevents delamination of the conductive material.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

FIGS. 2A to 2D are schematic cross-sectional views showing a method for fabricating a conductive via structure according to the present invention.

Figure 1A:
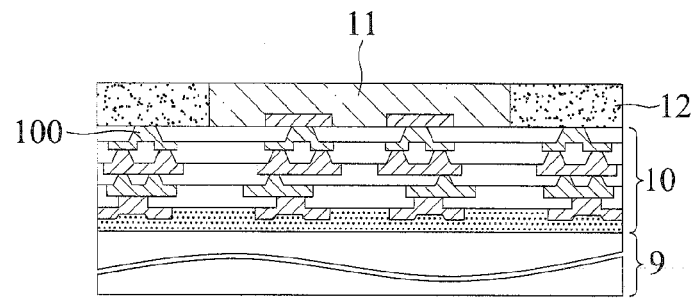
FIGS. 1A to 1D are schematic cross-sectional views showing a method for fabricating a conductive via structure according to the prior art, wherein FIG. 1C' is a partially enlarged view of FIG. 1C and FIG. 1C" shows another embodiment of FIG. 1C'.
Figure 1B:
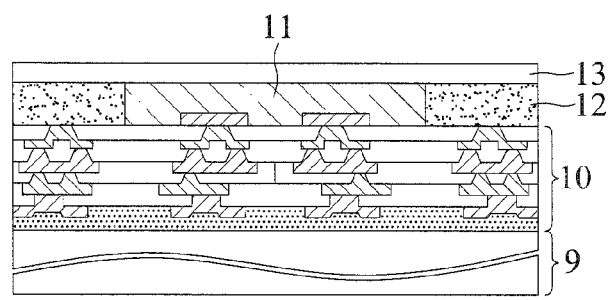
Figure 1C:
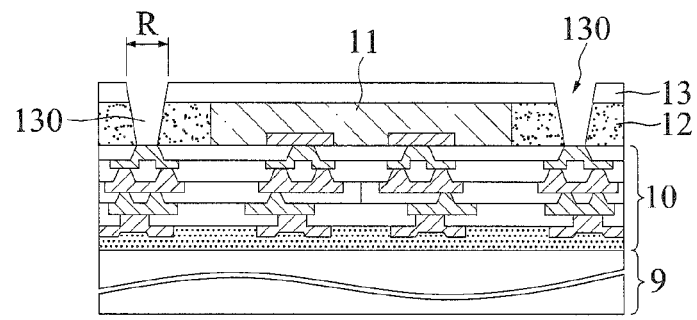
Figure 1C:
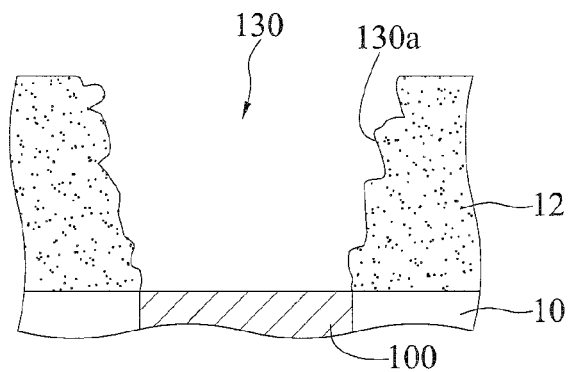
Figure 1D:
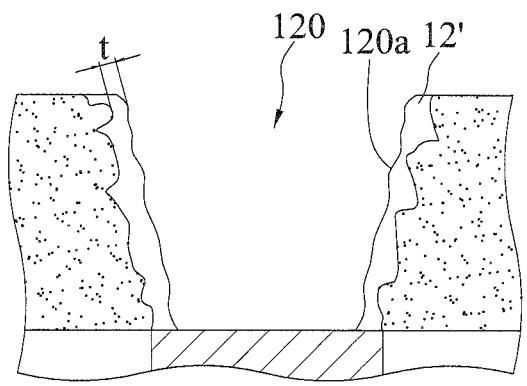
Figure 1D:
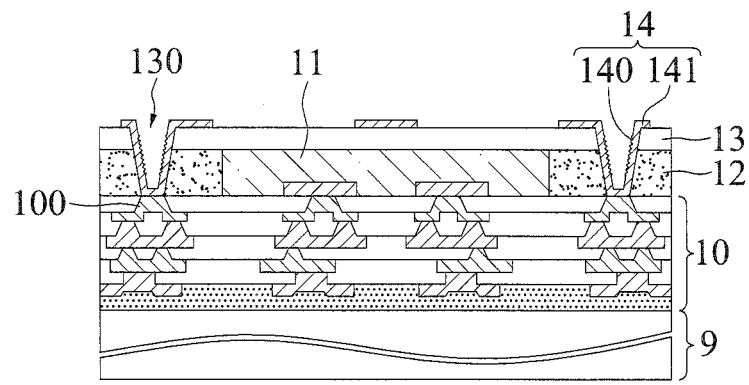
Figure 1E:
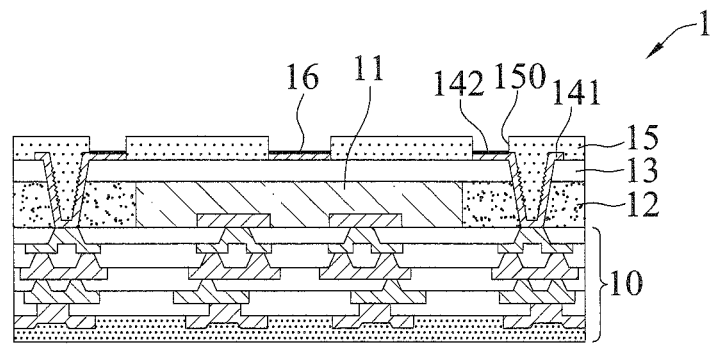
FIG. 1E is a schematic cross-sectional view showing subsequent processes after the process of FIG. 1D.
Figure 2A:
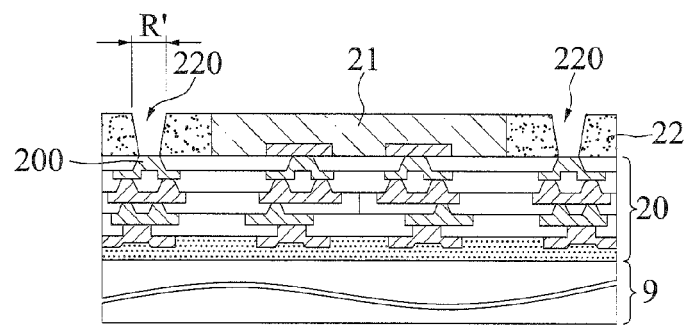
FIGS. 2A to 2D are schematic cross-sectional views showing a method for fabricating a conductive via structure according to the present invention, wherein FIG. 2C' is a partially enlarged view of FIG. 2C and FIG. 2D' shows another embodiment of FIG. 2D.

Referring to FIG. 2A, a carrier 20 is disposed on a support member 9. An electronic element 21 is disposed on the carrier 20 and an encapsulant 22 is formed on the carrier 21 to encapsulate the electronic element 21. Then, a plurality of openings 220 are formed to penetrate the encapsulant 22.

In the present embodiment, the carrier 20 is a packaging substrate and has a plurality of circuit layers 200. The uppermost circuit layer 200 is exposed from the openings 220 of the encapsulant 22. In other embodiments, the carrier 20 can be, but not limited to, an interposer, a semiconductor structure or a lead frame.

The openings 220 have a maximum width R' of 40 to 400 um. The openings 220 are formed by laser drilling and hence have irregular rough wall surfaces 220a, as shown in FIG. 2C'. The wall surfaces 220a of the openings 220 have an average roughness Ra of 2 to 60 um.

The electronic element 21 is a semiconductor element, such as an active element or a passive element. In an embodiment, a plurality semiconductor elements can be provided, which can be active elements, passive elements or a combination thereof. The active elements are, for example, chips. The passive elements are, for example, resistors, capacitors and inductors.

Figure 2B:
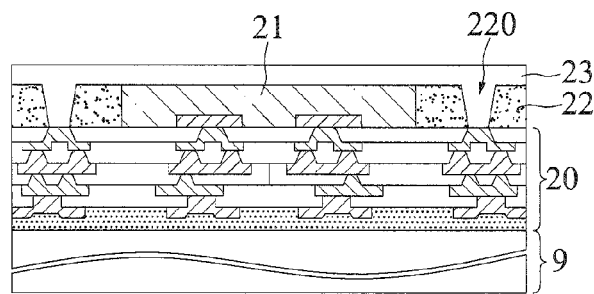
Figure 2C:
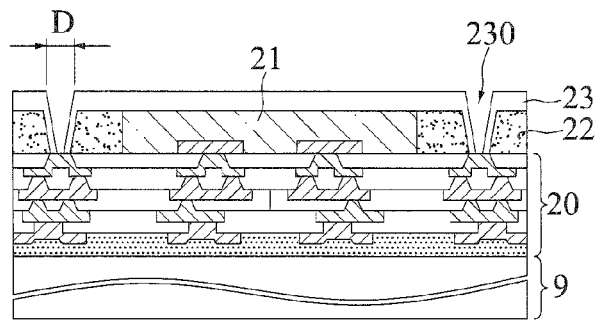
Figure 2C:
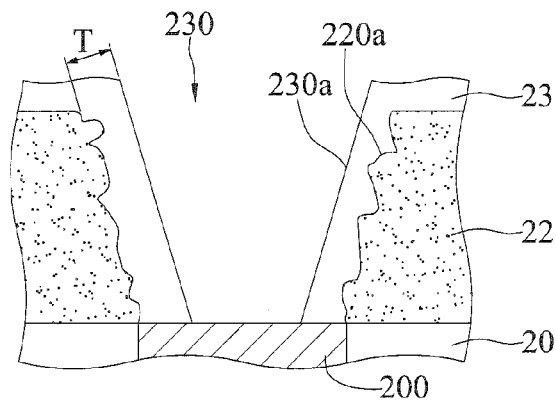

Referring to FIG. 2B, a dielectric layer 23 is formed on the encapsulant 22 and filled in the openings 220 of the encapsulant 22.

In the present embodiment, the dielectric layer 23 is made of a photosensitive material.

Referring to FIG. 2C, a plurality of vias 230 are formed in the dielectric layer 23 in the openings 220 of the encapsulant 22.

In the present embodiment, the uppermost circuit layer 200 is partially exposed from the vias 230.

The vias 230 are formed by exposure and therefore have even wall surfaces 230a, as shown in FIG. 2C'.

The vias 230 are of a tapered shape and have a maximum width D of 30 to 350 um.

The dielectric layer 23 in the openings 220 of the encapsulant 22 has a thickness T of 30 to 50 um, as shown in FIG. 2C'.

Figure 2D:
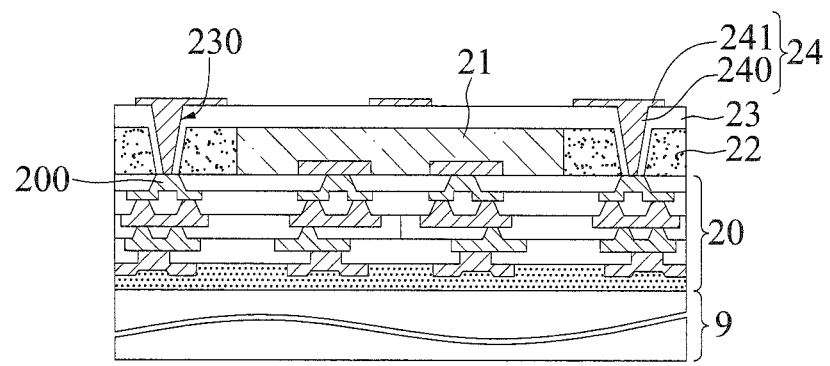
Figure 2D:
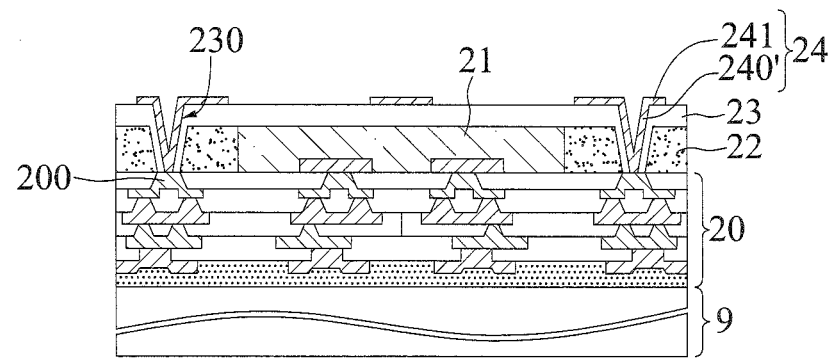

Referring to FIG. 2D, a conductive material 24 is formed on the dielectric layer 23 and in the vias 230. As such, the conductive material 24 on the dielectric layer 23 forms a redistribution layer 241 and the conductive material 24 in the vias 230 forms a plurality of conductive vias 240.

In the present embodiment, the conductive material 24 is formed by electroplating or deposition and the vias 230 are completely filled with the conductive material 24. In another embodiment, referring to FIG. 2D', the vias 230 are only partially filled with the conductive material 24, thus forming a plurality of conductive vias 240'.

The conductive vias 240, 240' electrically connect the uppermost circuit layer 200 and the redistribution layer 241.

Figure 2E:
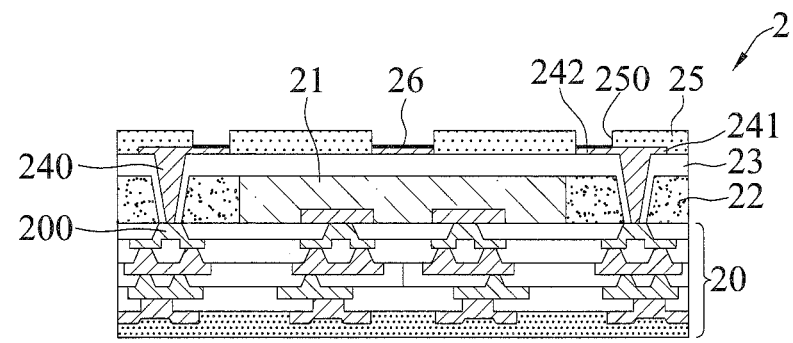
FIG. 2E is a schematic cross-sectional view showing subsequent processes after the process of FIG. 2D.

Subsequently, referring to FIG. 2E, an insulating layer 25 is formed on the redistribution layer 241 and the dielectric layer 23, and a plurality of openings 250 are formed in the insulating layer 25 for exposing conductive pads 242 of the redistribution layer 241. Thereafter, a plurality of conductive elements such as solder balls (not shown) can be mounted on the exposed conductive pads 242, thereby forming a semiconductor package 2. The semiconductor package 2 can further be connected to an electronic device, such as another package, a semiconductor element or a packaging substrate, through the conductive elements. Finally, the support member 9 is removed.

In addition, a surface processing layer 26 can be formed on the conductive pads 242 before mounting the conductive elements.

Therefore, by filling the openings 220 with the dielectric layer 23 first and then forming the vias 230 in the dielectric layer 23 through exposure, the present invention overcomes the drawback of roughness of the wall surfaces 220a of the openings 220.

Further, since the vias 230 are formed by exposure and the dielectric layer 23 in the openings 220 has a sufficient thickness T, the vias 230 are formed with even wall surfaces 230a. As such, the present invention prevents concentration of electric charges on protruding portions of the wall surfaces of the conductive vias 240, 240' as in the prior art, thereby preventing joule heating caused by accumulation of too many electric charges and hence preventing an open circuit from occurring. Therefore, the present invention improves the quality of the conductive vias 240, 240' and increases the reliability of the semiconductor package 2.

Furthermore, since copper is compatible with the dielectric layer 23, when the conductive material 24 is formed by electroplating or deposition, the copper seed layer (not shown) formed by sputtering does not peel off from the wall surfaces 230a of the vias 230, thereby preventing delamination of the conductive material 24, improving the quality of the conductive vias 240, 240' and increasing the reliability of the semiconductor package 2.

The present invention provides a conductive via structure, which has: an encapsulant 22 having a plurality of openings 220 penetrating therethrough; a dielectric layer 23 formed on the encapsulant 22 and filled in the openings 220 of the encapsulant 22, wherein a plurality of vias 230 are formed in the dielectric layer 23 in the openings 220 of the encapsulant 22; and a conductive material 24 filled in the vias 230.

The openings 220 have uneven wall surfaces 220a. The wall surfaces 220a of the openings 220 have an average roughness of 2 to 60 um. The openings 220 have a maximum width R' of 40 to 400 um.

The dielectric layer 23 is made of a photosensitive material. The vias 230 have even wall surfaces 230a. The vias 230 have a maximum width D of 30 to 350 um.

The conductive material 24 is filled in the vias 230 so as to form conductive vias 240, 240'.

In an embodiment, the dielectric layer 23 in the openings 220 has a thickness T of 30 to 50 um.

In an embodiment, the vias 230 are completely filled with the conductive material 24.

In an embodiment, the conductive material 24 is copper.

Therefore, by filling the openings having rough wall surfaces with the dielectric layer so as to form the vias having even wall surfaces in the dielectric layer, the present invention avoids open circuit and peeling of copper, thus improving the quality of the conductive vias without increasing the material cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A conductive via structure, comprising:
   an encapsulant having a plurality of openings penetrating therethrough;
   a dielectric layer formed on the encapsulant and filled in the openings of the encapsulant, wherein a plurality of vias are formed in the dielectric layer in the openings of the encapsulant and have even wall surfaces, and the dielectric layer is made of a photosensitive material; and
   a conductive material filled in the vias.

2. The structure of claim 1, wherein the openings of the encapsulant have uneven wall surfaces.

3. The structure of claim 1, wherein the wall surfaces of the openings have an average roughness of 2 to 60 um.

4. The structure of claim 1, wherein the openings have a maximum width of 40 to 400 um.

5. The structure of claim 1, wherein the dielectric layer in the openings of the encapsulant has a thickness of 30 to 50 um.

6. The structure of claim 1, wherein the vias have a maximum width of 30 to 350 um.

7. The structure of claim 1, wherein the conductive material is copper.

8. The structure of claim 1, wherein the vias are completely filled with the conductive material.

9. A method for fabricating a conductive via structure, comprising the steps of:
   forming in an encapsulant a plurality of openings penetrating therethrough;
   forming a dielectric layer made of a photosensitive material on the encapsulant and in the openings of the encapsulant;
   forming a plurality of vias in the dielectric layer in the openings of the encapsulant by exposure, wherein the vias have even wall surfaces; and
   forming a conductive material in the vias.

10. The method of claim 9, wherein the openings of the encapsulant are formed by laser drilling.

11. The method of claim 9, wherein wall surfaces of the openings have an average roughness of 2 to 60 um.

12. The method of claim 9, wherein the openings have a maximum width of 40 to 400 um.

13. The method of claim 9, wherein the dielectric layer in the openings of the encapsulant has a thickness of 30 to 50 um.

14. The method of claim 9, wherein the vias have a maximum width of 30 to 350 um.

15. The method of claim 9, wherein the conductive material is copper.

16. The method of claim 9, wherein the conductive material is formed by electroplating.

* * * * *